United States Patent [19]

Sawada

[11] Patent Number: 5,514,994
[45] Date of Patent: May 7, 1996

[54] BOOTSTRAP CIRCUIT

[75] Inventor: Kikuzo Sawada, Tokyo, Japan

[73] Assignee: Nippon Steel Corporation, Tokyo, Japan

[21] Appl. No.: 525,344

[22] Filed: Sep. 7, 1995

[30] Foreign Application Priority Data

Sep. 9, 1994 [JP] Japan .................. 6-242100

[51] Int. Cl.$^6$ .................................................. H03K 17/16
[52] U.S. Cl. .......................................... 327/390; 327/589
[58] Field of Search ............................ 327/390, 589

[56] References Cited

U.S. PATENT DOCUMENTS

| 4,061,933 | 12/1977 | Schroeder et al. | 327/589 |
| 4,508,978 | 4/1985 | Reddy | 327/589 |
| 4,529,889 | 7/1985 | Dumbri | 327/589 |
| 4,574,273 | 3/1986 | Atsumi et al. | 327/589 |
| 4,587,441 | 5/1986 | Torelli et al. | 327/589 |
| 4,902,919 | 2/1990 | Spohrer et al. | 327/589 |
| 4,914,323 | 4/1990 | Shibata | 327/589 |

Primary Examiner—Margaret Rose Wambach
Attorney, Agent, or Firm—Pollock, Vande Sande & Priddy

[57] ABSTRACT

A bootstrap circuit particularly suitable for low voltage applications and use with semiconductor memories is disclosed.

16 Claims, 4 Drawing Sheets

5,514,994

1

BOOTSTRAP CIRCUIT

BACKGROUND OF THE INVENTION

1. Field of the Invention

The present invention relates to a bootstrap circuit particularly suitable for a low voltage driven bootstrap circuit to be used with a voltage booster for a semiconductor memory such as DRAM and a flash memory.

2. Description of the Related Art

A charge pump circuit is used as a voltage booster for a semiconductor memory such as DRAM and a flash memory. The voltage booster is required to generate a desired high and stable potential in a predetermined time. In order to boost a voltage at high speed, a charge pump circuit has been used to which an input clock having a voltage higher than a power source voltage $V_{DD}$ is supplied.

A conventional bootstrap circuit has a structure such as shown in FIG. 1. The operation of this bootstrap circuit will be described with reference to FIGS. 2A to 2D. FIGS. 2A to 2D show waveforms of potentials changing with time at an input terminal IN, a node $N_{121}$, a node $N_{122}$, and a node $N_{123}$ (output terminal OUT), respectively of the circuit shown in FIG. 1.

As the potential at the input terminal IN rises as shown in FIG. 2A from the ground potential $V_{SS}$ to the power source voltage $V_{DD}$ during the time period from time $t_1$ to time $t_2$, the potential at the node $N_{123}$ connected via an N-channel enhancement MOS transistor $M_{121}$ to the input terminal IN starts rising from the ground potential $V_{SS}$ as shown in FIG. 2D. The transistor $M_{121}$ is in an on-state with the power source voltage $V_{DD}$ being applied to its gate. On the other hand, the potential at the node $N_{122}$ connected via an inverter $IV_{121}$ to the input terminal IN starts gradually lowering from the power source voltage $V_{DD}$ toward the ground potential $V_{SS}$ by the function of a capacitor $C_{122}$ as shown in FIG. 2C. At this time, however, the potential at the node $N_{121}$ remains to be the ground potential $V_{SS}$ as shown in FIG. 2B because an N-channel enhancement MOS transistor $M_{123}$ with its gate being connected to the node $N_{122}$ is in an on-state.

After the potential at the node $N_{122}$ continues lowering and becomes lower than the threshold voltage of the transistor $M_{123}$, the transistor $M_{123}$ changes from the on-state to the off-state. On the other hand, after the potential at the node $N_{123}$ continues rising and becomes higher than the threshold voltage of an N-channel enhancement transistor $M_{122}$ with its gate connected to the node $N_{123}$, the transistor $M_{122}$ changes from the off-state to the on-state. As a result, the potential at the node $N_{121}$ starts rising from the ground potential $V_{SS}$ to the power source voltage $V_{DD}$ (at time $t_3$ shown in FIGS. 2B).

As the potential at the node $N_{121}$ starts rising, the potential at the node $N_{123}$ further rises by the amount corresponding to a rise of the potential at the node $N_{121}$ because of the function of the capacitor $C_{121}$. With the feedback function of the capacitor $C_{121}$, the potential at the node $N_{123}$ (i.e., output terminal OUT) rises higher than the power source voltage $V_{DD}$ (at time $t_4$ shown in FIG. 2D). At the time when the potential at the node $N_{123}$ becomes the power source voltage $V_{DD}$, a potential difference between the gate and source/drain of the transistor $M_{121}$ is small. Therefore, regardless of the higher potential at the node $N_{123}$ than the power source voltage $V_{DD}$, current will not flow from the node $N_{123}$ to the input terminal IN.

2

Next, as the potential at the input terminal IN lowers as shown in FIG. 2A from $V_{DD}$ to $V_{SS}$ during the time period from time $t_5$ to time $t_7$, the potential at the node $N_{122}$ connected via the inverter $IV_{121}$ to the input terminal IN starts rising as shown in FIG. 2C. When the potential at the node $N_{122}$ exceeds the threshold voltage of the transistor $M_{123}$ (at time $t_6$), the transistor $M_{123}$ changes from the off-state to the on-state and the potential at the node $N_{121}$ starts lowering as shown in FIG. 2B. As a result, the potential at the node $N_{123}$ also starts lowering as shown in FIG. 2D. When the potential at the node $N_{123}$ becomes lower than the threshold voltage of the transistor $M_{123}$, the transistor $M_{122}$ changes from the on-state to the off-state and the node $N_{121}$ is disconnected from the power source terminal. On the other hand, as the potential at the input terminal IN lowers and the potential at the node $N_{123}$ lowers, the transistor $M_{121}$ with its gate to which the power source voltage $V_{DD}$ is applied changes from the on-state to the off-state, and current flows from the node $N_{123}$ to the input terminal IN so that the potential at the node $N_{123}$ becomes the ground potential $V_{SS}$ (at time $t_8$ show in FIG. 2D). Then, at time $t_9$ the potentials at both the nodes $N_{121}$ and $N_{122}$ become the ground potential $V_{SS}$ (refer to FIGS. 2B and 2C).

With the above operations, a pulse signal having a larger voltage than the power source voltage $V_{DD}$ is obtained at the output terminal OUT, and the pulse signal can be used as a clock input to a charge pump circuit.

Although the conventional bootstrap circuit described above can obtain a pulse signal having a higher voltage than the power source voltage $V_{DD}$, the boost of the output voltage is not still sufficient. Specifically, as the potential at the node $N_{121}$ of the circuit shown in FIG. 1 rises to the power source voltage $V_{DD}$, the output voltage should rise to $2 V_{DD}$ in an ideal case. However, in an actual case, it rises only to $2 V_{DD} - V_{th}$ because of the threshold voltage $V_{th}$ of the transistor $M_{121}$ which functions as a switching transistor (refer to FIG. 2D).

Further, in the conventional bootstrap circuit, it is relatively difficult for the transistor $M_{122}$ to turn on because it is an N-channel transistor. The conventional bootstrap circuit is therefore associated with a problem that linearity of the rise of the output pulse is insufficient. If the bootstrap circuit is driven at a low power source voltage, particularly at about 1 V, the transistor $M_{122}$ does not turn on in some cases.

Still further, in the conventional bootstrap circuit, the voltage fall at the node $N_{123}$ upon the fall of the output pulse is achieved by flowing current via the transistor $M_{121}$ to the input terminal IN. A voltage fall at the node $N_{123}$ is therefore relatively slow. This results in a problem of a long fall time of the output pulse.

SUMMARY OF THE INVENTION

It is an object of the present invention to provide a bootstrap circuit having a voltage boost ability higher than conventional, providing a reliable operation even at a low power source voltage, and being able to shorten a fall time of the output pulse.

According to one aspect of the present invention, there is provided a bootstrap circuit comprising:

a first enhancement N-channel MOS transistor having a drain connected to an input terminal of the bootstrap circuit and a source connected to an output terminal of the bootstrap circuit;

a first enhancement P-channel MOS transistor having a gate connected via a first inverter to the source of the

3 first enhancement N-channel MOS transistor and a drain connected to a power source terminal;

a first capacitor having one terminal connected to a source of the first enhancement P-channel MOS transistor and the other terminal connected to the source of the first enhancement N-channel MOS transistor;

a second enhancement N-channel MOS transistor having a drain connected to the source of the first enhancement P-channel MOS transistor, a source connected to a ground terminal, and a gate connected via a second inverter to the input terminal;

a second capacitor having one terminal connected to an input terminal of the second inverter and the other terminal connected to the ground terminal; and gate potential controlling means for controlling a gate potential of the first enhancement N-channel MOS transistor so as to raise the gate potential to a power source potential or higher during a predetermined time period immediately after an input signal applied to the input terminal rises and to maintain the gate potential to be substantially the same as the power source potential during a time period other than the predetermined time period.

The gate potential controlling means may comprise:

a third capacitor having one terminal connected to the input terminal and the other terminal connected to a gate of the first enhancement N-channel MOS transistor;

a second enhancement P-channel MOS transistor having a gate connected to the input terminal, a drain connected to the power source terminal, and a source connected to the gate of the first enhancement N-channel MOS transistor;

a third enhancement P-channel MOS transistor having a drain connected to the power source terminal and a source connected to the gate of the first enhancement N-channel MOS transistor; and a delay circuit connected between the input terminal and a gate of the third enhancement P-channel MOS transistor, the delay circuit determining the predetermined time period during which the gate potential of the first enhancement N-channel MOS transistor is raised.

The bootstrap circuit may further include a third N-channel MOS transistor having a drain connected to the source of the first enhancement N-channel MOS transistor, a source connected to the ground terminal, and a gate connected via a third inverter to the input terminal.

An output terminal of the third inverter may be connected via a fourth inverter to the input terminal of the second inverter, and an output terminal of the second inverter may be connected to a gate of the third enhancement P-channel MOS transistor.

A fourth P-channel MOS transistor included in the fourth inverter and the second capacitor may control the predetermined time period during which the gate potential of the first enhancement N-channel MOS transistor is raised.

According to the present invention, the gate potential of the first N-channel MOS transistor used as the switching transistor of the bootstrap circuit is raised to a power source voltage or higher during a predetermined time period immediately after the input signal rises. Accordingly, the influence of the threshold voltage of the transistor can be eliminated and an output voltage generally two times as high as the power source voltage can be obtained.

Therefore, a relatively high output voltage can be obtained even at a low power source voltage. By using this output as an input pulse to a charge pump circuit, a voltage boost speed of the charge pump circuit can be improved.

The first enhancement P-channel MOS transistor is used as the MOS transistor constituting the feedback section. Accordingly, this transistor is easy to turn on while ensuring a reliable operation even at a low power source voltage.

Furthermore, provision of the third N-channel MOS transistor between the output terminal and the ground terminal allows a voltage fall at the output terminal to be performed in a short time. Accordingly, an output signal having a short fall time can be obtained, improving an operation speed of the bootstrap circuit.

DETAILED DESCRIPTION OF THE PREFERRED EMBODIMENTS

Figure 1:
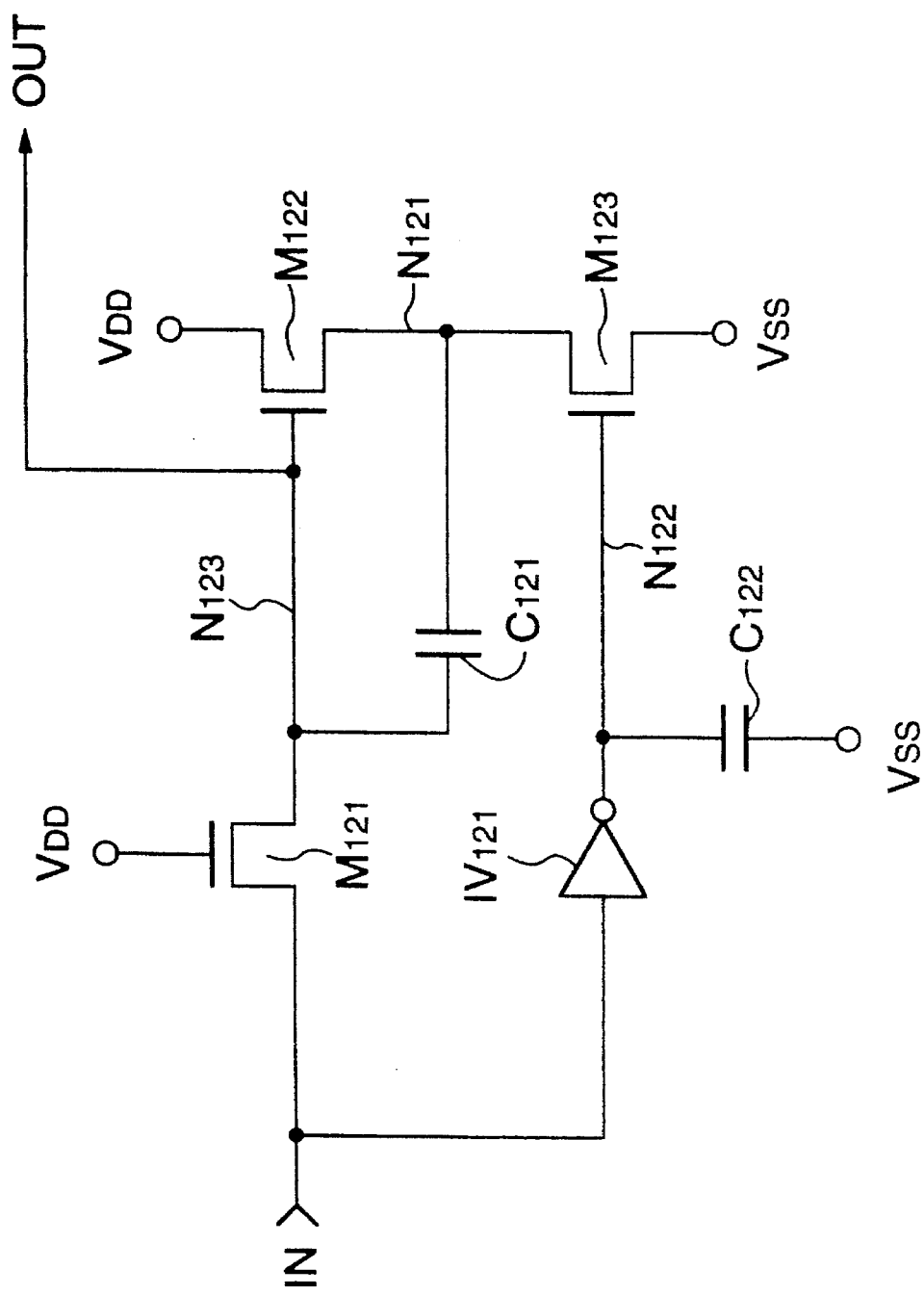
FIG. 1 is a circuit diagram of a conventional bootstrap circuit.
Figure 2A:
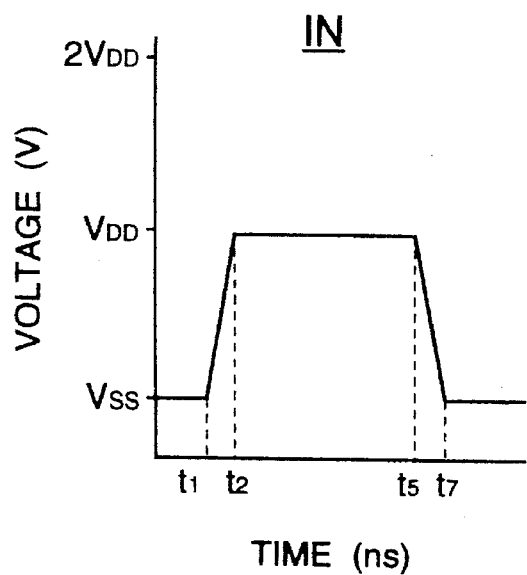
FIGS. 2A to 2D show waveforms at various points of the circuit shown in FIG. 1.
Figure 2B:
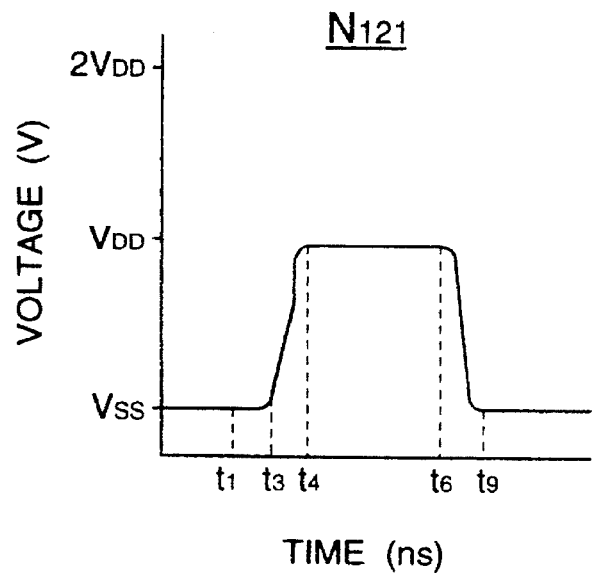
Figure 2C:
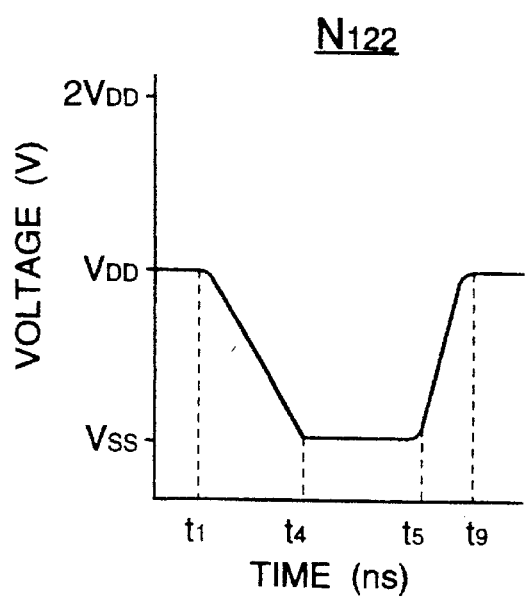
Figure 2D:
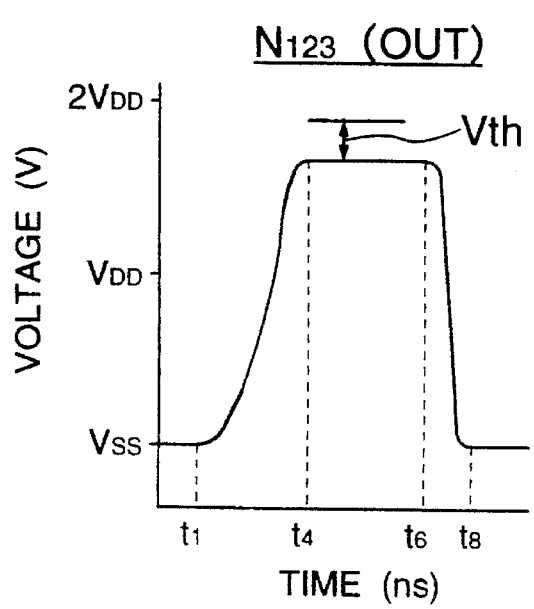
Figure 3:
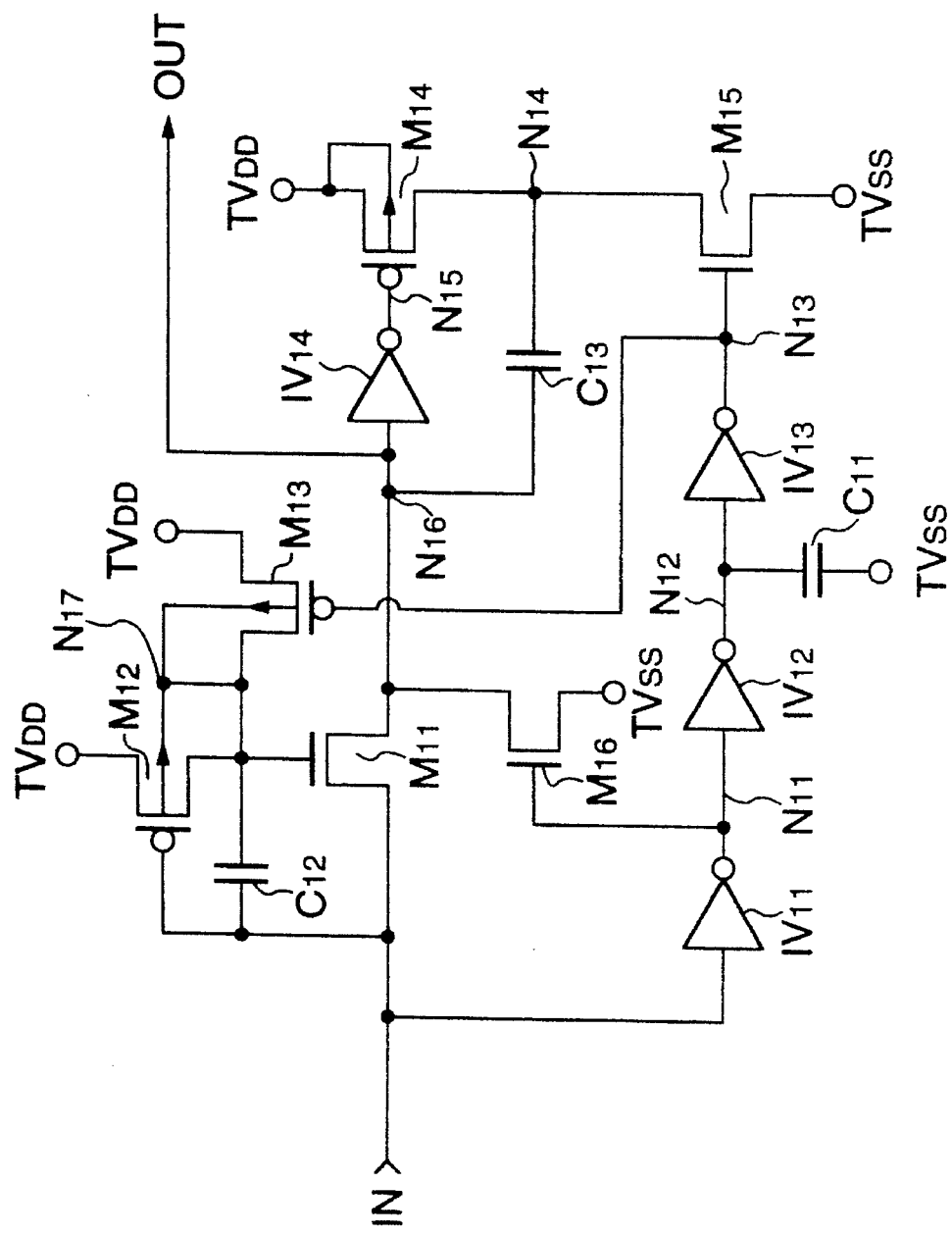
FIG. 3 is a circuit diagram of a bootstrap circuit according to an embodiment of the present invention.

As shown in FIG. 3, in a bootstrap circuit according to an embodiment of the present invention, an input terminal IN is connected to the drain of an enhancement N-channel MOS transistor $M_{11}$, to the gate of an enhancement P-channel MOS transistor $M_{12}$, to one terminal of a capacitor $C_{12}$, and to the input terminal of an inverter $IV_{11}$. The source of the transistor $M_{11}$ is connected to a node $N_{16}$. This node $N_{16}$ is connected to an output terminal OUT, the input terminal of an inverter $IV_{14}$, to one end of a capacitor $C_{13}$, and to the drain of an enhancement N-channel MOS transistor $M_{16}$. The drain of the transistor $M_{12}$ is connected to a power source terminal $TV_{DD}$, and the source thereof is connected via a node $N_{17}$ to the gate of the transistor $M_{11}$. The node $N_{17}$ is connected to the other terminal of the capacitor $C_{12}$ and to the source of an enhancement P-channel MOS transistor $M_{13}$. Also connected to the nodes $N_{17}$ are the substrate terminals of the transistors $M_{12}$ and $M_{13}$. The drain of the transistor $M_{13}$ is connected to the power source terminal $TV_{DD}$.

The output terminal of the inverter $IV_{14}$ is connected via a node $N_{15}$ to the gate of an enhancement P-channel MOS transistor $M_{14}$. The drain and substrate terminal of the transistor $M_{14}$ are connected to the power source terminal $TV_{DD}$, and the source thereof is connected to a node $N_{14}$. The node $N_{14}$ is connected to the other terminal of the capacitor $C_{13}$ and to the drain of an enhancement N-channel MOS transistor $M_{15}$. The source of the transistor $M_{15}$ is connected to a ground terminal $TV_{SS}$.

The output terminal of the inverter $IV_{11}$ is connected via a node $N_{11}$ to the input terminal of an inverter $IV_{12}$. The node $N_{11}$ is also connected to the gate of the transistor $M_{16}$. The source of the transistor $M_{16}$ is connected to the ground terminal $TV_{SS}$. The output terminal of the inverter $IV_{12}$ is connected via a node $N_{12}$ to the input terminal of an inverter $IV_{13}$. The node $N_{12}$ is connected to one terminal of a capacitor $C_{11}$ the other terminal of which is connected to the ground terminal $TV_{SS}$. The output terminal of the inverter $IV_{13}$ is connected via a node $N_{13}$ to the gate of the transistor $M_{13}$ and to the gate of the transistor $M_{15}$.

Next, the operation of the bootstrap circuit of this embodiment constructed as above will be described with reference to FIGS. 4A to 4F. FIGS. 4A to 4F show waveforms of potentials changing with time at the input terminal IN, output terminal OUT (node $N_{16}$), and nodes $N_{17}$, $N_{14}$, $N_{11}$, and $N_{13}$, respectively of the circuit shown in FIG. 3. Being different from FIGS. 2A to 2D, FIGS. 4A to 4F mainly illustrate a low level part of an input signal. A power source voltage $V_{DD}$ is 1 volt.

While the input signal takes a low level (ground voltage $V_{SS}$), the P-channel transistor $M_{12}$ is in an on-state. Therefore, the power source voltage $V_{DD}$ is being applied to the gate of the N-channel transistor $M_{11}$ which maintains the on-state. Since the potential at the node $N_{11}$ is at a high level (power source voltage $V_{DD}$), the N-channel transistor $M_{16}$ is in the on-state. Therefore, the potential at the node $N_{16}$ is at the low level (ground voltage $V_{SS}$). Since the potential at the node $N_{15}$ is at the high level (power source voltage $V_{DD}$), the P-channel transistor $M_{14}$ is in an off-state so that the node $N_{14}$ is disconnected from the power source terminal $TV_{DD}$. Since the potential at the node $N_{13}$ is at the high level (power source voltage $V_{DD}$), the P-channel transistor $M_{13}$ is in the off-state, the N-channel transistor $M_{15}$ is in the on-state, and the potential at the node $N_{14}$ is at the low level (ground voltage $V_{SS}$).

Figure 4A:
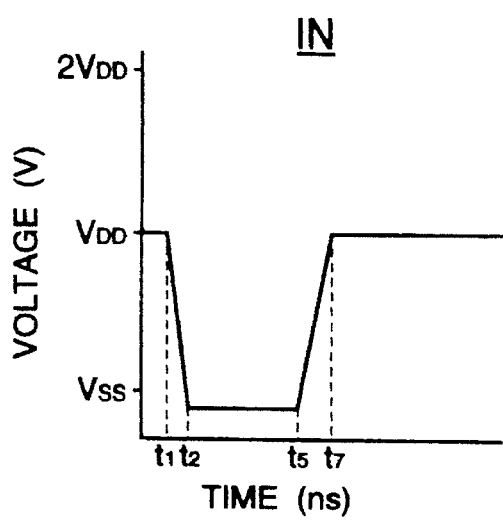
FIGS. 4A to 4F show waveforms at various points of the circuit shown in FIG. 3.
Figure 4B:
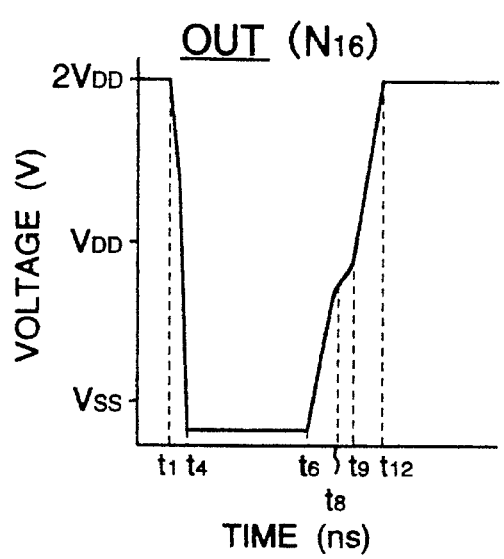
Figure 4C:
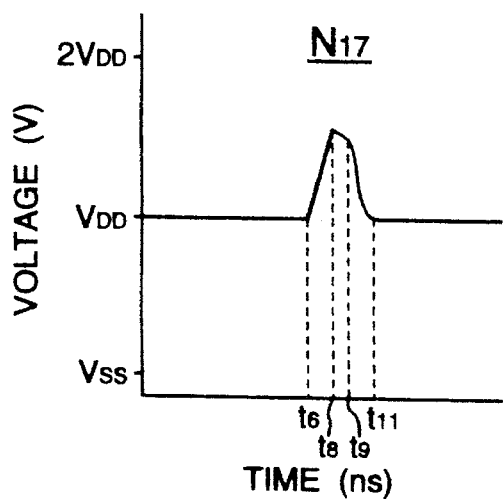
Figure 4D:
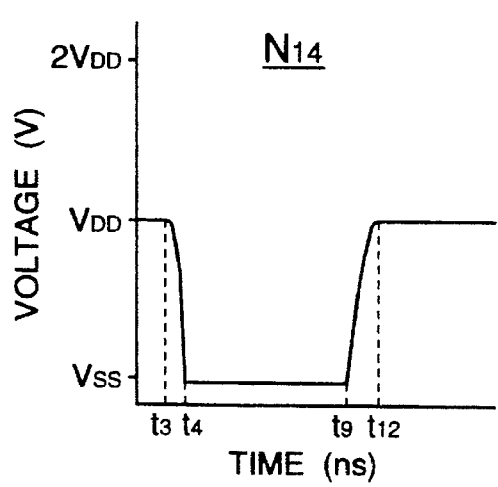
Figure 4E:
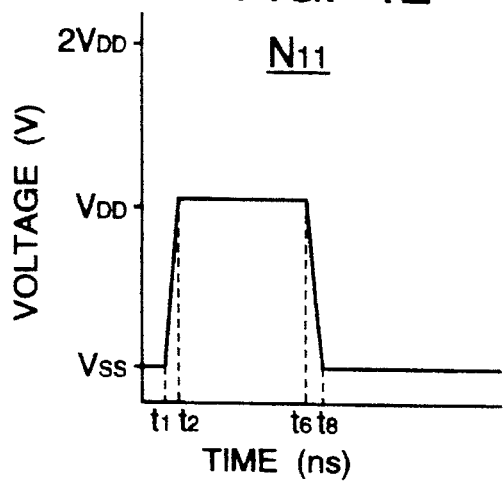

Next, as the potential at the input terminal IN rises at time $t_5$ as shown in FIG. 4A from the ground voltage $V_{SS}$ to the power source voltage $V_{DD}$, the potential at the node $N_{11}$ connected via the inverter $IV_{11}$ to the input terminal IN starts lowering from the power source voltage $V_{DD}$ to the ground voltage $V_{SS}$ (at time $t_6$ shown in FIG. 4E). As a result, the N-channel transistor $M_{16}$ changes from the on-state to the off-state and the potential at the node $N_{16}$ connected via the transistor $M_{11}$ to the input terminal IN starts rising (refer to FIG. 4B). On the other hand, as the potential at the input terminal IN rises from the ground voltage $V_{SS}$ to the power source voltage $V_{DD}$, the P-channel transistor $M_{12}$ changes from the on-state to the off-state and the potential at the node $N_{17}$ starts rising (at time $t_6$ shown in FIG. 4C) because of the function of charges stored in the capacitor $C_{12}$.

In some short time after the potential at the input terminal IN reaches the power source voltage $V_{DD}$, the potential at the node $N_{17}$ takes a peak value (at time $t_8$ shown in FIG. 4C). Because of this potential rise at the node $N_{17}$, i.e., at the gate of the N-channel transistor $M_{11}$, the potential at the node $N_{16}$ rises near to the power source voltage $V_{DD}$ (refer to FIG. 4B). If the gate potential of the transistor $M_{11}$ were fixed to the power source voltage $V_{DD}$ as in the conventional circuit, the potential at the node $N_{16}$ at this time rises only to $V_{DD} - V_{th}$ ($V_{th}$ is the threshold voltage of the transistor $M_{11}$). However, in this embodiment, since the gate potential of the transistor $M_{11}$ is raised to the power source voltage $V_{DD}$ or higher, the potential at the node $N_{16}$ rises near to the power source voltage $V_{DD}$. In this case, if the gate potential of the transistor $M_{11}$ is raised to $V_{DD}+V_{th}$ or higher, the potential at the node $N_{16}$ reaches the power source voltage $V_{DD}$.

Figure 4F:
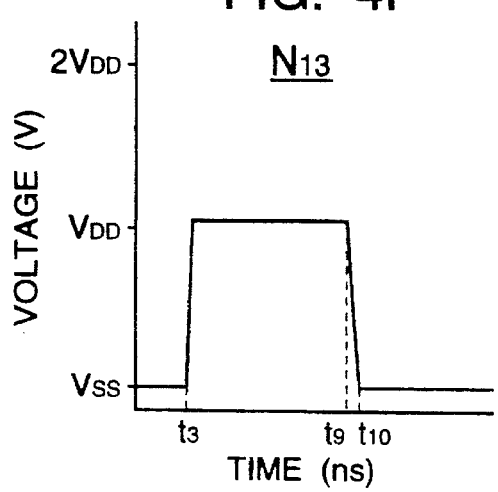

Thereafter, during the time period from time $t_9$ to time $t_{10}$, the potential at the node $N_{13}$ lowers from the power source voltage $V_{DD}$ to the ground voltage $V_{SS}$ (refer to FIG. 4F). A time difference or delay time between the time $t_9$ when the potential at the node $N_{13}$ starts lowering and the time $t_5$ when the potential at the input terminal IN starts rising, results from the function of the inverters $IV_{11}$, $IV_{12}$, $IV_{13}$ and capacitor $C_{11}$. In this embodiment, this delay time is mainly controlled by a resistance $R_c$ of a P-channel transistor (not shown) used in the inverter $IV_{12}$ and a capacitance $C_s$ of the capacitor $C_{11}$.

As the potential at the node $N_{13}$ lowers, the P-channel transistor $M_{13}$ changes from the off-state to the on-state and the potential at the node $N_{17}$ lowers to the power source voltage $V_{DD}$ (during the time period from time $t_9$ to time $t_{11}$ shown in FIG. 4C). In an actual case, the potential at the node $N_{17}$ starts lowering earlier than time $T_9$ in an actual case because of leak current. As the gate potential of the N-channel transistor lowers, the transistor $M_{11}$ changes from the on-state to the off-state and the node $N_{16}$ is disconnected from the input terminal IN.

As the potential at the node $N_{13}$ lowers, the N-channel transistor $M_{15}$ changes from the on-state to the off-state and the node $N_{14}$ is disconnected from the ground terminal $TV_{SS}$. By this time, since the potential at the node $N_{16}$ has risen to about the power source voltage $V_{DD}$ (refer to FIG. 4B), the potential at the node $N_{15}$ connected via the inverter $IV_{14}$ to the node $N_{16}$ has lowered to about the ground voltage $V_{SS}$. Therefore, the P-channel transistor $M_{14}$ is in the on-state and the node $N_{14}$ is connected to the power source terminal $TV_{DD}$. Then, the potential at the node $N_{14}$ starts rising from the ground voltage $V_{SS}$ to the power source voltage $V_{DD}$ (refer to FIG. 4D). By the feedback operation of the capacitor $C_{13}$, the potential at the node $N_{16}$, i.e., at the output terminal OUT, is raised over the power source voltage $V_{DD}$ (refer to FIG. 4B). In this embodiment, since the potential at the node $N_{16}$ is near at the power source voltage $V_{DD}$ and the transistor $M_{11}$ is in the off-state when the feedback operation starts, the potential at the output terminal OUT is raised nearly to the voltage of 2 $V_{DD}$ (at time $t_{12}$ shown in FIG. 4B).

Also in this embodiment, the transistor relevant to the feedback operation is constituted by the P-channel transistor $M_{14}$, the reliable operation of the P-channel transistor $M_{14}$ is ensured even at a low power source voltage of, for example, about 1 V.

Next, like the time period from time $t_1$ to time $t_2$, as the potential at the input terminal IN starts lowering from the power source voltage $V_{DD}$ to the ground voltage $V_{SS}$, the potential at the node $N_{11}$ starts rising from the ground voltage $V_{SS}$ to the power source voltage $V_{DD}$ (refer to FIG. 4E) and the N-channel transistor $M_{16}$ changes from the off-state to the on-state. Therefore, the node $N_{16}$ is connected to the ground terminal $TV_{SS}$ and the potential at the output terminal OUT lowers quickly (during the time period from time $t_1$ to time $t_4$ shown in FIG. 4B). As the potentials at the input terminal IN and node $N_{16}$ lower, also the N-channel transistor $M_{11}$ with the power source voltage $V_{DD}$ being applied to its gate changes from the off-state to the on-state, and so the node $N_{16}$ is connected to the input terminal IN.

As the potential at the node $N_{13}$ starts rising from the ground voltage $V_{SS}$ to the power source voltage $V_{DD}$ (at time $t_3$ shown in FIG. 4F), the N-channel transistor $M_{15}$ changes from the off-state to the on-state. Therefore, the node $N_{14}$ is connected to the ground terminal $TV_{SS}$ and the potential at the node $N_{14}$ lowers from the power source voltage $V_{DD}$ to the ground voltage $V_{SS}$ (during the time period from time $t_3$ to time $t_4$ shown in FIG. 4D). As the potential at the node $N_{15}$ rises, the P-channel transistor $M_{14}$ changes from the on-state to the off-state and the node $N_{14}$ is disconnected from the power source terminal $TV_{DD}$.

As the potential at the input terminal IN lowers, the P-channel transistor $M_{12}$ changes from the off-state to the on-state, whereas as the potential at the node $N_{13}$ rises, the P-channel transistor $M_{13}$ changes from the on-state to the off-state.

With the above-described operations, an output pulse having a voltage of approximately 2 $V_{DD}$ boosted from the power source voltage $V_{DD}$ can be obtained.

The input signal pulse used in this embodiment has the fall edge steeper than the rise edge. It is therefore uncertain whether the potential at the node $N_{16}$ (output terminal OUT) can be lowered more rapidly than the conventional circuit. However, it is to be noted at least that the voltage fall at the node $N_{16}$ is more rapid than when the transistor $M_{16}$ is not used.

The present invention has been described in connection with the preferred embodiment. The present invention is not intended to be limited only to this embodiment. For example, in the above embodiment, although the delay circuit for controlling the gate potential of the N-channel transistor $M_{11}$ is mainly constituted by the inverter $IN_{12}$ (P-channel transistor used therein) and the capacitor $C_{11}$, a transistor gate circuit may be used for the delay circuit.

What is claimed is:

1. A bootstrap circuit comprising:
   a first enhancement N-channel MOS (Metal Oxide Semiconductor) transistor having a drain connected to an input terminal of the bootstrap circuit and a source connected to an output terminal of the bootstrap circuit;
   a first enhancement P-channel MOS transistor having a gate connected via a first inverter to the source of said first enhancement N-channel MOS transistor and a drain connected to a power source terminal;
   a first capacitor having one terminal connected to a source of said first enhancement P-channel MOS transistor and the other terminal connected to the source of said first enhancement N-channel MOS transistor;
   a second enhancement N-channel MOS transistor having a drain connected to the source of said first enhancement P-channel MOS transistor, a source connected to a ground terminal, and a gate connected via a second inverter to said input terminal;
   a second capacitor having one terminal connected to an input terminal of said second inverter and the other terminal connected to the ground terminal; and
   gate potential controlling means for controlling a gate potential of said first enhancement N-channel MOS transistor so as to raise the gate potential to a power source potential or higher during a predetermined time period immediately after an input signal applied to said input terminal rises and to maintain the gate potential to be substantially the same as the power source potential during a time period other than said predetermined time period.

2. A bootstrap circuit according to claim 1, wherein said gate potential controlling means comprises:
   a third capacitor having one terminal connected to said input terminal and the other terminal connected to a gate of said first enhancement N-channel MOS transistor;
   a second enhancement P-channel MOS transistor having a gate connected to said input terminal, a drain connected to the power source terminal, and a source connected to the gate of said first enhancement N-channel MOS transistor;
   a third enhancement P-channel MOS transistor having a drain connected to the power source terminal and a source connected to the gate of said first enhancement N-channel MOS transistor; and
   a delay circuit connected between said input terminal and a gate of said third enhancement P-channel MOS transistor, said delay circuit determining said predetermined time period during which the gate potential of said first enhancement N-channel MOS transistor is raised.

3. A bootstrap circuit according to claim 2, further including a third enhancement N-channel MOS transistor having a drain connected to the source of said first enhancement N-channel MOS transistor, a source connected to the ground terminal, and a gate connected via a third inverter to said input terminal.

4. A bootstrap circuit according to claim 3, wherein an output terminal of said third inverter is connected via a fourth inverter to the input terminal of said second inverter, and an output terminal of said second inverter is connected to a gate of said third enhancement P-channel MOS transistor.

5. A bootstrap circuit according to claim 4, wherein a fourth P-channel MOS transistor included in said fourth inverter and said second capacitor control said predetermined time period during which the gate potential of said first enhancement N-channel MOS transistor is raised.

6. A bootstrap circuit comprising:
   an input terminal to which an input signal to the bootstrap circuit is applied;
   an output terminal of the bootstrap circuit;
   a power source terminal to which a power source voltage is supplied;
   a ground terminal;
   a first enhancement N-channel MOS (Metal Oxide Semiconductor) transistor having a drain connected to said input terminal and a source connected to said output terminal;
   a first inverter having an input port connected to the source of said first enhancement N-channel MOS transistor;
   a first enhancement P-channel MOS transistor having a gate connected to an output port of said first inverter and a drain connected to said power source terminal:
   a first capacitor having one terminal connected to the source of said first enhancement P-channel MOS transistor and having the other terminal connected to the source of said first enhancement N-channel MOS transistor;
   a second enhancement N-channel MOS transistor having a drain connected to the source of said first enhancement P-channel MOS transistor and a source connected to said ground terminal;
   a delay circuit for delaying said input signal, said delay circuit being connected between said input terminal and a gate of said second enhancement N-channel MOS transistor; and
   gate potential controlling means for controlling a gate potential of said first enhancement N-channel MOS transistor, by using said input signal and said input signal delayed by said delay circuit, so as to raise the gate potential to said power source voltage or higher during a predetermined time period immediately after said input signal rises and to maintain the gate potential to be substantially the same as said power source voltage during a time period other than said predetermined time period.

7. A bootstrap circuit according to claim 6, wherein said delay circuit comprises:
   a second inverter having an input port connected to said input terminal;

a third inverter having an input port connected to an output port of said second inverter:

a second capacitor having one terminal connected to an output port of said third inverter and the other terminal connected to said ground terminal; and a fourth inverter having an input port connected to the one terminal of said second capacitor and an output port connected to the gate of said second enhancement N-channel MOS transistor.

8. A bootstrap circuit according to claim 6, wherein said gate potential controlling means comprises:

a third capacitor having one terminal connected to said input terminal and the other terminal connected to a gate of said first enhancement N-channel MOS transistor;

a second enhancement P-channel MOS transistor having a gate connected to said input terminal, a drain connected to said power source terminal, and a source connected to the gate of said first enhancement N-channel MOS transistor; and a third enhancement P-channel MOS transistor having a drain connected to said power source terminal, a source connected to the gate of said first enhancement N-channel MOS transistor, and a gate inputted with said input signal delayed by said delay circuit.

9. A bootstrap circuit according to claim 7, wherein said gate potential controlling means comprises:

a third capacitor having one terminal connected to said input terminal and the other terminal connected to a gate of said first enhancement N-channel MOS transistor;

a second enhancement P-channel MOS transistor having a gate connected to said input terminal, a drain connected to said power source terminal, and a source connected to the gate of said first enhancement N-channel MOS transistor; and a third enhancement P-channel MOS transistor having a drain connected to said power source terminal, a source connected to the gate of said first enhancement N-channel MOS transistor, and a gate connected to the output port of said fourth inverter.

10. A bootstrap circuit according to claim 7, further comprising a third enhancement N-channel MOS transistor having a drain connected to the source of said first enhancement N-channel MOS transistor, a source connected to said ground terminal, and a gate connected to the output port of said second inverter.

11. A bootstrap circuit according to claim 8, further comprising a third enhancement N-channel MOS transistor having a drain connected to the source of said first enhancement N-channel MOS transistor, a source connected to said ground terminal, and a gate connected to the output port of said second inverter.

12. A bootstrap circuit according to claim 9, further comprising a third enhancement N-channel MOS transistor having a drain connected to the source of said first enhancement N-channel MOS transistor, a source connected to said ground terminal, and a gate connected to the output port of said second inverter.

13. A bootstrap circuit according to claim 7, wherein said predetermined time period during which the gate potential of said first enhancement N-channel MOS transistor is raised, is controlled by a P-channel MOS transistor included in said third inverter of said delay circuit and by said second capacitor.

14. A bootstrap circuit according to claim 9, wherein said predetermined time period during which the gate potential of said first enhancement N-channel MOS transistor is raised, is controlled by a P-channel MOS transistor included in said third inverter of said delay circuit and by said second capacitor.

15. A bootstrap circuit according to claim 10, wherein said predetermined time period during which the gate potential of said first enhancement N-channel MOS transistor is raised, is controlled by a P-channel MOS transistor included in said third inverter of said delay circuit and by said second capacitor.

16. A bootstrap circuit according to claim 12, wherein said predetermined time period during which the gate potential of said first enhancement N-channel MOS transistor is raised, is controlled by a P-channel MOS transistor included in said third inverter of said delay circuit and by said second capacitor.

* * * * *